United States Patent [19]

Fushimoto

[11] 4,451,121

[45] May 29, 1984

[54] ELECTRONIC APPLIANCE

[75] Inventor: Hideo Fushimoto, Kawasaki, Japan

[73] Assignee: Canon Kabushiki Kaisha, Tokyo, Japan

[21] Appl. No.: 390,940

[22] Filed: Jun. 22, 1982

Related U.S. Application Data

[63] Continuation of Ser. No. 102,789, Dec. 12, 1979, abandoned.

[30] Foreign Application Priority Data

Dec. 15, 1978 [JP] Japan .................. 53-155236

[51] Int. Cl.³ .................. G02F 1/13; H01L 39/02
[52] U.S. Cl. .................. 350/331 R; 350/338; 350/345; 357/80
[58] Field of Search .................. 350/331 R, 334, 345, 350/332, 338; 340/718; 357/74, 80; 315/169.3

[56] References Cited

U.S. PATENT DOCUMENTS

| | | | |
|---|---|---|---|
| 4,012,117 | 3/1977 | Lazzery | 350/331 R |
| 4,165,607 | 8/1979 | Fedorowicz et al. | 350/334 X |
| 4,184,153 | 1/1980 | Glaubitz | 350/345 X |
| 4,194,833 | 3/1980 | Lester et al. | 350/331 R |

Primary Examiner—John K. Corbin
Assistant Examiner—Richard F. Gallivan
Attorney, Agent, or Firm—Fitzpatrick, Cella, Harper & Scinto

[57] ABSTRACT

A display device for electronic appliances, wherein a table having an inclined surface and connectors to connect a display implement and printed wires formed on a printed base board are interposed between the display implement and a single sheet of the printed board. By urging the display device toward the printed base board, the display implement is supported in inclination with respect to the printed base board by urging the former to the latter.

6 Claims, 12 Drawing Figures

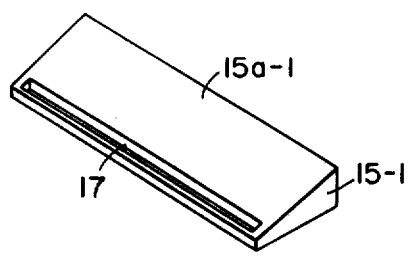
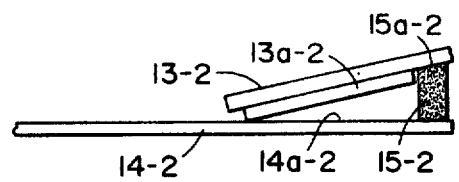
FIG. 7  FIG. 8
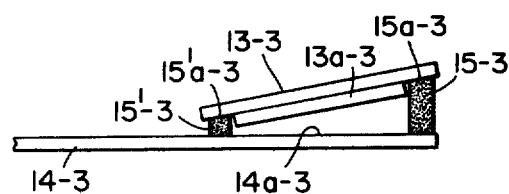
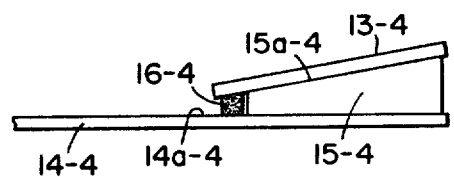
FIG. 9  FIG. 10
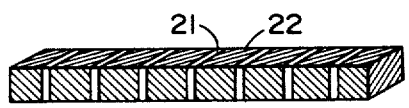
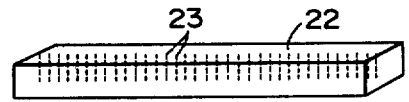
FIG. 11A  FIG. 11B

ELECTRONIC APPLIANCE

This is a continuation of application Ser. No. 102,789, filed Dec. 12, 1979, now abandoned.

BACKGROUND OF THE INVENTION

1. Field of the Invention

This invention relates to a desk type electronic calculator, and other electronic appliances provided with a display device.

2. Description of the Prior Arts

Some of the display devices for the electronic appliances use liquid crystal in their character display section. However, since the liquid crystal display device, from its physical characteristic, has a narrow visual field, it occurs not infrequently that reading of characters displayed on this liquid crystal display section becomes very difficult, when a key board section 2 of the desk type electronic calculator 1 and the display device 3 are situated in one and the same plane, as shown in FIG. 1 of the accompanying drawing. Therefore, for those electronic calculators which are ordinarily placed on a desk for use, the display section 3a alone is inclined with respect to the key board section 2a of the desk type electronic calculator 1a as shown in FIG. 2 for easiness in reading the displayed characters. According to this construction, however, as the display section 3a is inclined with respect to the key board section 2a, it becomes necessary to provide two printed base boards for the signal connection in the liquid crystal display device 3a as shown in FIG. 3, i.e., the one for performing signal processing and operational processing in the key board section, and the other for processing signals from the liquid crystal display device, and these two printed based boards should be further connected with a cable 6. Therefore, the step for the device assembly inevitably increases, which has been the cause for increase in the manufacturing cost. Further, instead of using two base boards which are connected by the connecting cable, there is used a single printed base board having flexibility, and this printed base board is bent at a desired angle to form the key board section and the display section, thereby saving the connecting cable. However, this printed base board is disadvantageously high in its cost. It is also contemplated that one and the same gradient is given to both key board section and display section to conduct signal processing with a single sheet of hard printed base board, thereby eliminating the abovementioned defects. With this construction, however, as the key board section is subjected to excessive inclination, a new problem would arise in respect of the key operations.

SUMMARY OF THE INVENTION

An object of the present invention is to improve the assembly and to reduce the cost of electronic applicances.

It is another object of the present invention to provide a display device for an electronic appliance, in which a position and an angle for fitting the display device to the electronic appliance can be accurately set.

It is still another object of the present invention to provide a display device for an electronic appliance, in which short-circuiting of the printed base board is prevented by a reflecting plate of the display device.

It is yet another object of the present invention to provide a display device for an electronic appliance, in which the electrical connection between the display device and the printed base board is dispensed with to thereby simplify the production steps.

It is still another object of the present invention to provide a display device for an electronic appliance, in which the reflecting plate is omitted from the display device to further simplify the production step.

It is a further object of the present invention to provide a display device for an electronic appliance which may be observed even in a dark site.

BRIEF DESCRIPTION OF THE DRAWINGS

FIGS. 1 to 3 show conventional desk type electronic calculators, wherein FIG. 1 is a perspective view of a desk type electronic calculator with its key board section and display section being disposed in one and the same plane; FIG. 2 is also a perspective view of another desk type electronic calculator with its display section being inclined with respect to tis key board section; and FIG. 3 is a side elevational view for explaining the connection between two printed base boards for the calculator shown in FIG. 2;

FIGS. 4 to 6 illustrate a preferred embodiment of the desk type electronic calculator according to the present invention, wherein FIG. 4 is a partially exploded view of the calculator; FIG. 5 is also a perspective view showing only the display section of the calculator; and FIG. 6 is a side elevational view of the same calculator shown in FIG. 5;

FIG. 7 is a perspective view of one embodiment of a table for the display section having an inclined surface;

FIGS. 8 to 10 show other embodiments of the table for the display section; and

FIGS. 11A and 11B are respectively perspective views showing preferred construction of the table or electrical connecting means incorporating in one part thereof an electrically conductive material.

DESCRIPTION OF THE PREFERRED EMBODIMENTS

Figure 4:
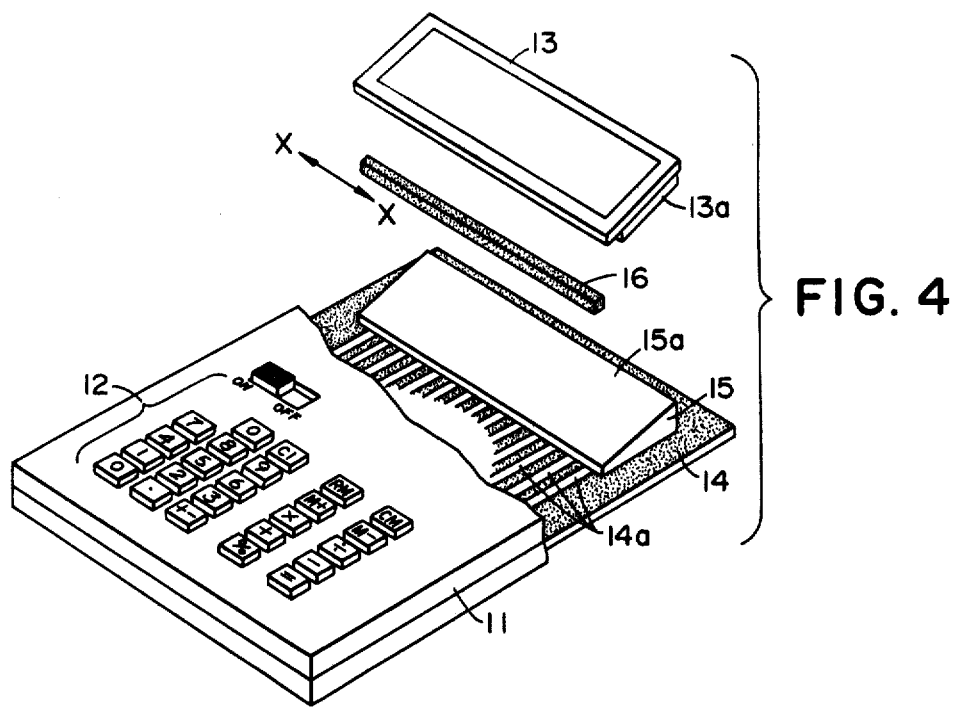
Figure 5:
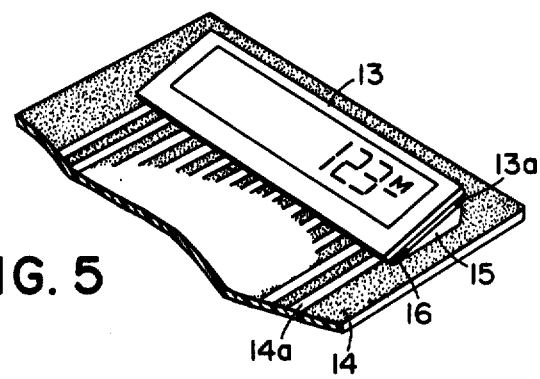
Figure 6:
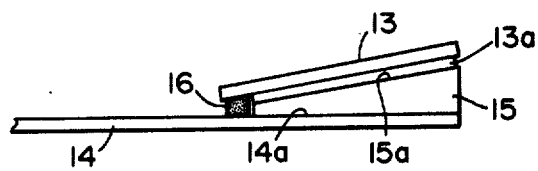

FIGS. 4 to 6 illustrate the first embodiment of the display device for an electronic appliance according to the present invention. In FIG. 4, a reference numeral 11 designates a main body of the desk type electronic calculator. A key board section 12 is provided at the lower half part on the top surface of the main body 11, and a display section 13 consisting of liquid crystal, light emitting diodes, etc. and having a reflecting plate 13a on its rear surface is provided at the upper half part on the top surface thereof. A numeral 14 refers to a printed base board, on which there are provided switch contact patterns at positions corresponding to the key board section 12. Further, to an unillustrated portion at the side of the display device, there are connected LSI's, resistors, batteries, etc. to be used for the operational processing of input data from the key-board section 12. Output informations from the abovementioned LSI's are produced on output terminals consisting of a multitude of linear printed wirings 14a. A reference numeral 15 designates a wedge-shaped table of synthetic rubber, plastic, and other similar material having elasticity and insulative property. The table extends in the direction X—X perpendicular to the cross-section of the wedge-shaped side surface with a width corresponding to that of the printed wirings 14a, and forms an inclined top surface. The table 15 is fixedly mounted on the printed base board 14 in a manner to cover the output terminals of the printed wirings 14a with its inclined surface 15a sloping down toward the key board section 12. A rod-shaped elastic connector 46 which is not conductive in the lengthwise direction (X—X) of the table 15, but is conductive only in the direction perpendicular to the lengthwise direction thereof is placed on the printed wirings 14a at the down (or front) end of the table 15. On the bottom rear surface of the display device 13, there are printed signal introducing terminals (not shown) corresponding to the linear printed wirings 14a to enable a predetermined display to be effected on the display device in accordance with input signals from the printed wirings 14a. In order to attain this, the display device 13, the table 15, and the connector 16 are urged toward the printed base board 14 for support thereon, with the reflecting plate 13a facing down, by means of a casing (not shown), metal fittings, etc. for the calculator main body 11, whereupon the table 15 and the connector 16 are compressed due to their elasticity, and the display device 13 is fixed onto the calculator main body 11 with a predetermined inclination on its top surface. Also, the signal introducing terminals of the display device and the printed wirings 14a connected in a one-to-one relationship, and the printed wirings 14a on the printed base board 14 can be prevented from short-circuiting caused by the reflecting plate 13a on the rear surface of the display device due to electrical insulation of the table 15. In the above-described embodiment, the table 15 has been explained as being elastic, although it may be made of a rigid material.

In the following, other embodiments of the present invention will be explained in reference to FIGS. 7 to 11(b). In these figures of the drawing, the part bearing the same reference numeral in the first part of the hyphenated reference numeral has the same function as that in the above-described first embodiment.

As shown in FIG. 7, the table 15-1 has a slit 17 formed in the lengthwise direction at the lower level of the inclined surface, in which the abovementioned connector is embedded. In so constructing the table 15-1, the connector can be accurately positioned with respect to the wiring 14a. The material for the table may be either rigid or elastic one.

Figure 1:
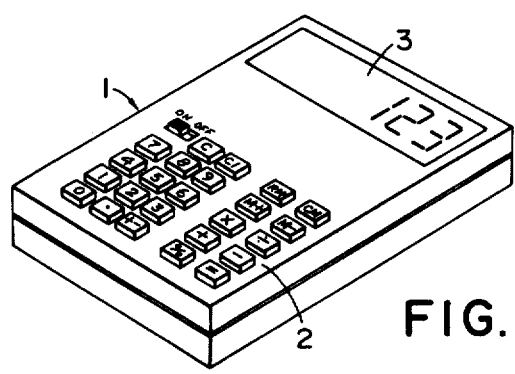
Figure 2:
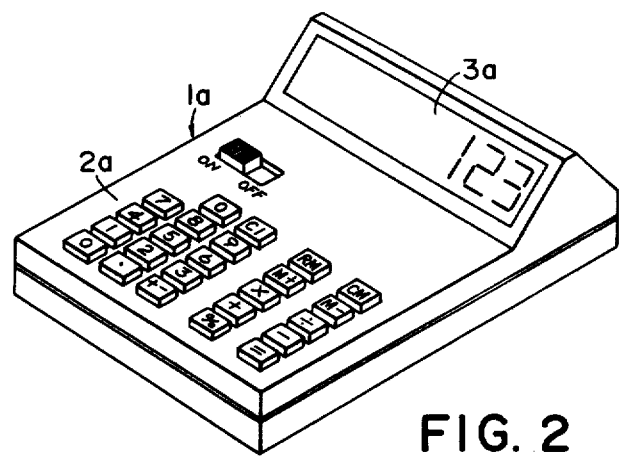
Figure 3:
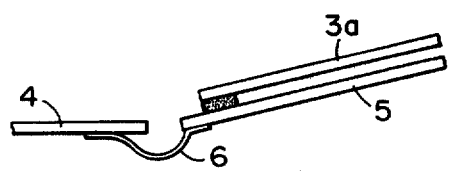

In still another embodiment of the present invention as shown in FIG. 8, the table 15-2 per se is manufactured with a material which is not conductive in the lengthwise direction same as the abovementioned connector, thereby omitting use of the connector. In this instance, since the abovementioned signal introducing terminals are printed on the upper rear surface of the display device 13-2 (though not shown in the drawing) unlike the embodiment shown in FIGS. 1 to 3, the signal introducing terminals are connected with the printed wirings 14a-2 (which are extended up to the position corresponding to the table 15-2) by means of the table 15-2, and the display device 13-2 is supported in inclination. In this instance, the table 15-2 is not necessarily in the wedge-shape from the beginning, but it may be made of an elastic material in a rod-shape having a rectangular cross-section. Such rod-shaped elastic table may be set on the printed base board 14-2 by urging it toward the board with a required inclination, whereby the number of parts used for the assembly can be reduced, hence the assembly steps.

In other embodiment of the present invention as shown in FIG. 9, the tables 15-3 and 15'-3 are formed of the same material as that of the abovementioned connectors, and two signal introducing terminals, similar to the abovementioned signal introducing terminals, are printed on both upper and lower rear surfaces of the display device 13-3, with which the printed wirings 14a-3 printed on the printed base board 14-3 are connected correspondingly. At this time, it may be feasible that an insulating material be filled between the reflecting plate 13a-3 and the printed base board 14-3 with a view to preventing a space gap from being formed, and that the tables 15'-3 and 15-3 may be formed integrally to thereby increase stability of the table. Since the signal introducing terminals on the upper and lower rear surfaces of the display device 13-3 can be connected with the printed wirings 14a-3 in the above-described manner, it becomes possible to make the character patterns in the display device to be more complicated.

In still other embodiment of the present invention as shown in FIG. 10, the table 15-4 is in the wedge-shaped cross-section as is the case with the first-mentioned embodiment with its top surface which extends in the direction perpendicular to the cross-sectional plane being inclined, and is made of a glossy material (e.g., the table is shaped with a synthetic resin material, over which surface a glossy material is coated by plating, evaporative deposition, and other similar treatments), thereby making it possible to dispense with the reflective plate to be provided on the display device. Also, when the table 15-4 is colored in a desired color, the display 13-4 will be brought to a colored condition. Still further, by forming the table 15-4 with a fluorescent material, it becomes possible to recognize the display even in a dark place.

In the above-described various embodiments, the connector and the table made of the similar material to the connector may be in such construction as shown in FIGS. 11A and 11B. The connector or table as shown in FIG. 11A is shaped in a rod form, in which an electrically conductive material 20 and an insulating material 21 are alternately arranged. Such connector or table may also be constructed as shown in FIG. 11B, in which the electrically conductive material such as metal wire, etc. is unidirectionally arranged within the insulative material 22. Besides these, there may be used a pressure-sensitive electrically conductive material which becomes conductive upon application thereto of a pressure in the direction of the pressure application.

What I claim is:

1. An electronic appliance, comprising:
   display means, having signal introducing terminals, for performing a display based on signals input thereto through said signal introducing terminals;
   a printed base board provided with printed wirings thereon connectable to said signal introducing terminals of said display means;
   a wedge-shaped table having an inclined surface for directly mounting said display means and being inclined with respect to said printed wirings provided on said printed base board, said table further being mounted on said printed base board and being formed of an insulating material that does not provide electrical contact between said display means and said printed base board; and
   an electrically conductive member for electrically connecting said printed wirings of said printed base board and said signal introducing terminals of said display means and interposed between said printed base board and said display means.

2. An electronic appliance as set forth in claim 1, wherein said table is made of a rigid material.

3. An electronic appliance as set forth in claim 1, wherein said table is made of an elastic material.

4. An electronic appliance as set forth in claim 1, wherein said table has a slit in which said electrically conductive member is embedded.

5. An electronic appliance as set forth in claim 1, wherein said table is made of a glossy or colored material.

6. An electronic appliance as set forth in claim 1, wherein said table is made of a fluorescent material.

* * * * *